United States Patent [19]

Nagano

[11] Patent Number: 4,475,087
[45] Date of Patent: Oct. 2, 1984

[54] VOLTAGE FOLLOWER CIRCUIT
[75] Inventor: Katsumi Nagano, Shimonoseki, Japan
[73] Assignee: Tokyo Shibaura Denki Kabushiki Kaisha, Kawasaki, Japan
[21] Appl. No.: 384,255
[22] Filed: Jun. 2, 1982
[30] Foreign Application Priority Data
  Jun. 10, 1981 [JP] Japan .................... 56-89288
[51] Int. Cl.³ .................... H03F 3/04; H03F 3/45
[52] U.S. Cl. .................... 330/288; 330/257; 330/311
[58] Field of Search ............ 330/257, 288, 310, 311
[56] References Cited
  U.S. PATENT DOCUMENTS
  4,223,276  9/1980  Nagano .................... 330/257
  OTHER PUBLICATIONS
Ahmed, "Zero-Offset Potential Follower Circuits", RCA Technical Notes, TN No. 938, Sep. 17, 1973, Sheets 1-7.

Primary Examiner—James B. Mullins
Attorney, Agent, or Firm—Finnegan, Henderson, Farabow, Garrett & Dunner

[57] ABSTRACT

A voltage follower circuit comprises first and second emitter-coupled transistors. The first transistor has its base connected to receive an input voltage, and the second transistor has its base shunted to its collector. A voltage transfer circuit is provided which includes a plurality of transistors each connected in the emitter follower configuration. The input of the voltage transfer circuit is connected to the collector of the second transistor to transfer the input voltage to the output thereof. The open-loop gain of the circuit is substantially unity, and an offset error voltage is extremely small.

5 Claims, 14 Drawing Figures

F I G. 2
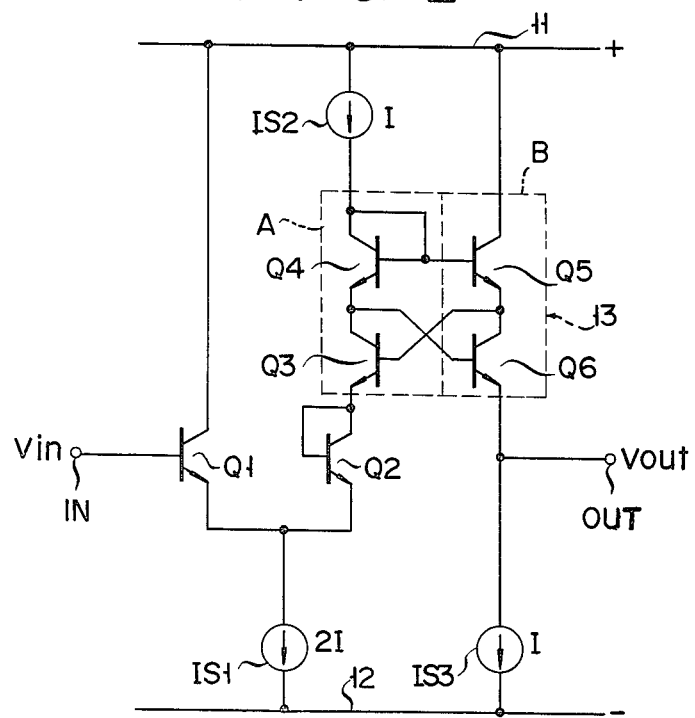

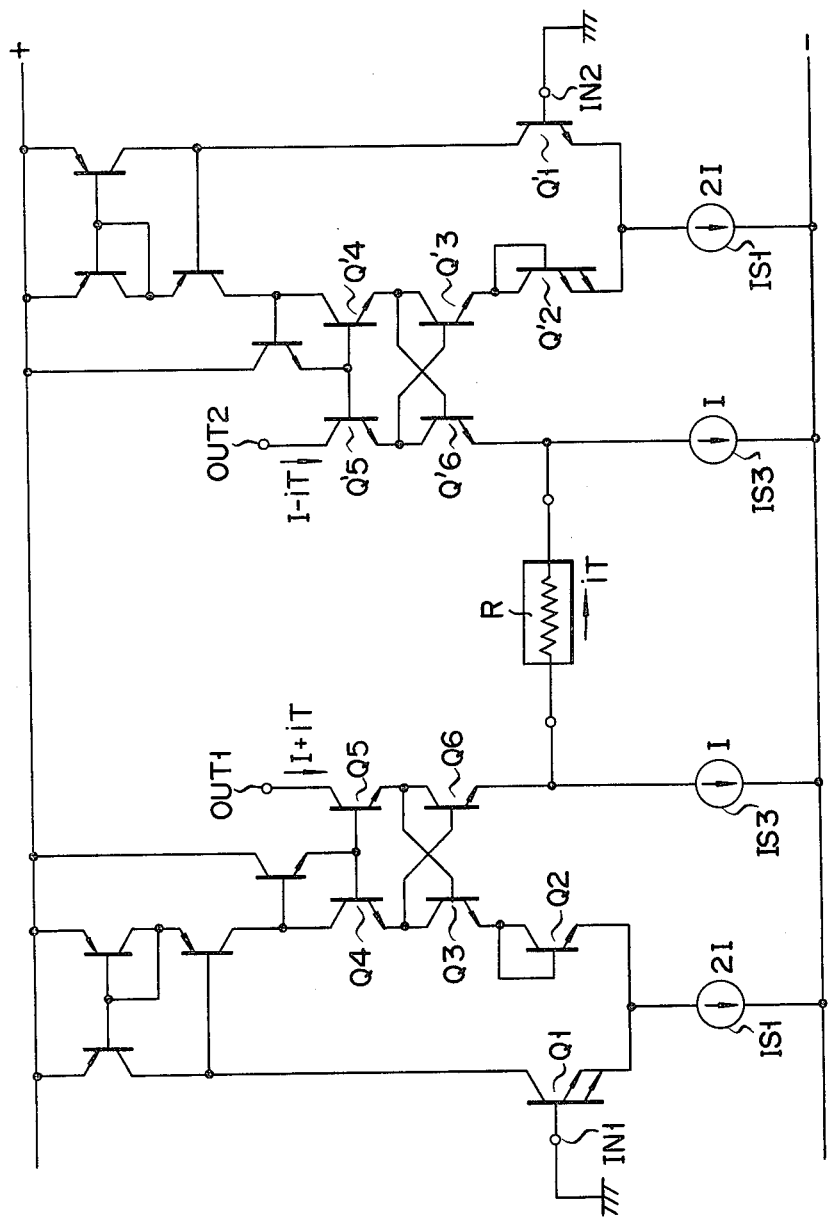
F I G. 13

F I G. 14
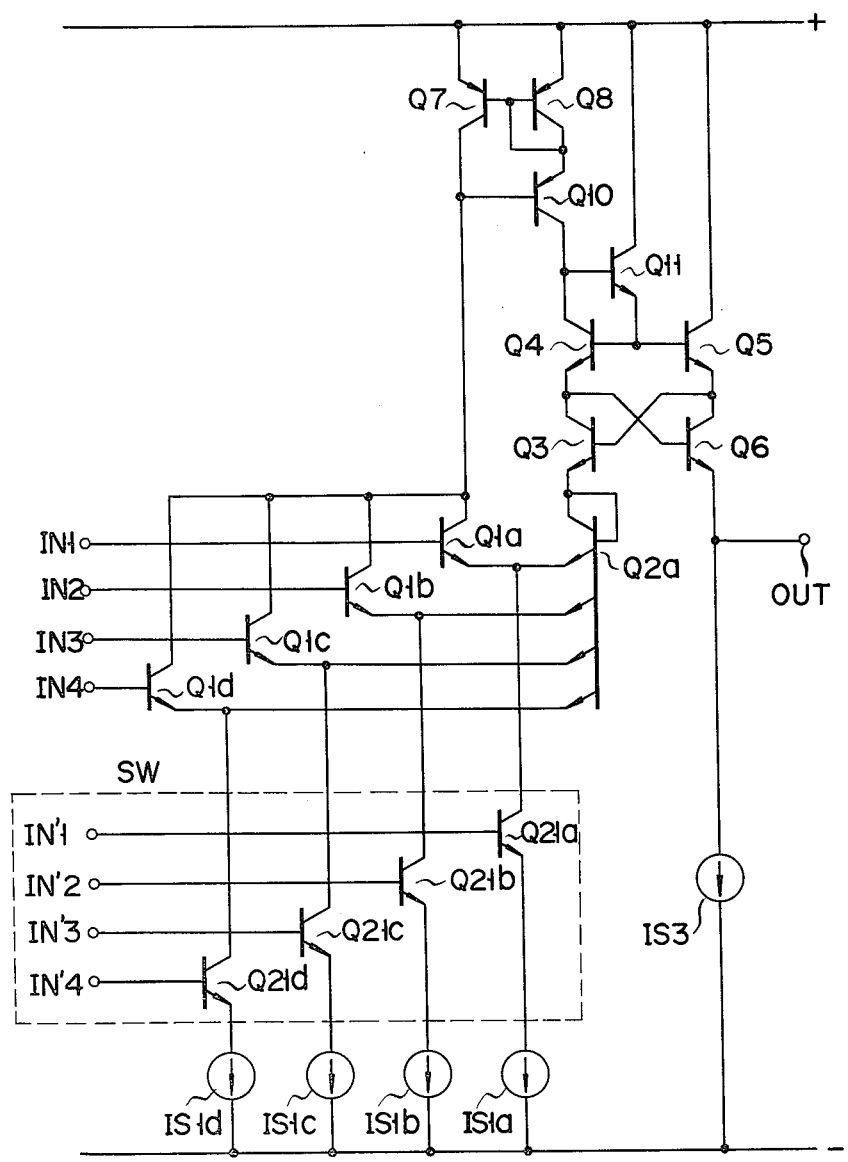

VOLTAGE FOLLOWER CIRCUIT

BACKGROUND OF THE INVENTION

The present invention relates to a voltage follower circuit.

A voltage follower circuit as shown in FIG. 1 is known. See FIG. 1 of U.S. Pat. No. 4,223,276, for example. However, this prior art circuit has a drawback that oscillation is liable to occur. In FIG. 2 of the above patent another voltage follower circuit is disclosed which includes a Miller capacitor for phase correction for the purpose of preventing oscillation. In this circuit, the frequency response is degraded and the adaptability for integrated circuits is impaired due to incorporation of the capacitor. In FIG. 3 of the above patent still another voltage follower circuit is disclosed which is arranged to reduce the open-loop gain by making the mutual conductance small for the purpose of preventing oscillation. Although this circuit's prevention of oscillation is improved, it presents a new problem of an increase in the offset voltage and hence of an increase in the output error.

SUMMARY OF THE INVENTION

It is an object of the present invention to provide a voltage follower circuit which is arranged to prevent oscillation and reduce the offset voltage.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

A voltage follower circuit of this invention, as embodied and broadly described herein, comprises first and second emitter-coupled transistors, the first transistor having its base connected to receive an input voltage, and the second transistor having its base shunted to its collector; and a voltage transfer circuit having an input coupled to the collector of the second transistor and an output for transferring a voltage substantially the same as the collector voltage of the second transistor; a first current source connected to the emitters of the first and second transistors; a current supply circuit for supplying a current to the second transistor through the voltage transfer circuit; a second current source connected to the output of the voltage transfer circuit; the voltage transfer circuit comprising third to sixth transistors, the third transistor having its emitter connected to the collector of the second transistor and its collector connected to an emitter of the fourth transistor, the fourth transistor having its collector connected to the current supply circuit and its base shunted to its collector, the sixth transistor having its emitter connected to the output of the voltage transfer circuit and its collector connected to an emitter of the fifth transistor, the third and sixth transistors being cross-coupled with respect to their bases and collectors and the fourth and fifth transistors having their bases connected together.

According to the voltage follower circuit of the present invention, the open-loop gain is substantially unity, so that oscillation is effectively prevented. Moreover, the offset error voltage may be decreased to a sufficiently small value.

The accompanying drawings, which are incorporated in and constitute a part of this specification, illustrate embodiments of the invention and, together with the description, serves to explain the principles of the invention.

BRIEF DESCRIPTION OF THE DRAWINGS

FIG. 2 is a circuit diagram of the basic arrangement of a voltage follower circuit according to the present invention;

FIGS. 9 to 14 show applied circuits using the basic arrangement of the voltage follower circuit of the present invention.

DETAILED DESCRIPTION OF THE PREFERRED EMBODIMENTS

FIG. 2 shows the basic arrangement of a voltage follower circuit embodying the present invention. This circuit comprises emitter-coupled transistors Q1 and Q2. Transistor Q1 has its base connected to an input terminal IN for receiving an input voltage Vin, and its collector connected to a positive power supply line 11. The emitters of transistors Q1 and Q2 are connected to a negative power supply line 12 through a constant current source IS1 for supplying current 2I. Between the collector of transistor Q2 and one end of a current source IS2 providing current I, the other end of which is connected to positive power supply line 11, is connected a circuit A having transistors Q3 and Q4 whose collector-emitter paths are series-connected. A circuit B having transistors Q5 and Q6 whose collector-emitter paths are series-connected is connected between positive power supply line 11 and an output terminal OUT from which an output voltage Vout is taken. Another constant current source IS3 for supplying current I is connected between output terminal OUT and negative power supply line 12.

The circuits A and B are interconnected as shown to form a voltage transfer circuit 13 for transferring the collector voltage of transistor Q2 to output terminal OUT. Namely, in circuit A, transistor Q3 has its emitter connected to the collector of transistor Q2 and its collector connected to the emitter of transistor Q4, and transistor Q4 has its collector connected to constant current source IS2. In circuit B, transistor Q6 has its emitter connected to output terminal OUT and its collector connected to the emitter of transistor Q5 whose collector is connected to positive power supply line 11. Transistors Q3 and Q6 are cross-coupled with respect to their bases and collectors. The base of transistor Q4 is shunted to its collector and is also connected to the base of transistor Q5.

In the circuit shown in FIG. 2, when the input voltage Vin is applied to input terminal IN, the output voltage Vout expressed by equation (1) below is obtained from output terminal OUT.

$$Vout = Vin - Vbe(Q1) + Vbe(Q2) + Vbe(Q3) + Vbe(Q5) - Vbe(Q4) - Vbe(Q6) \quad (1)$$

where Vbe(Q1) to Vbe(Q6) are base-emitter voltages of transistors Q1 to Q6, respectively. If Vbe(Q1) to Vbe(Q6) are identical, we obtain:

$$Vout = Vin \quad (2)$$

However, since Vbe(Q1) to Vbe(Q6) are not exactly identical, an offset error voltage Vos occurs.

Figure 1:
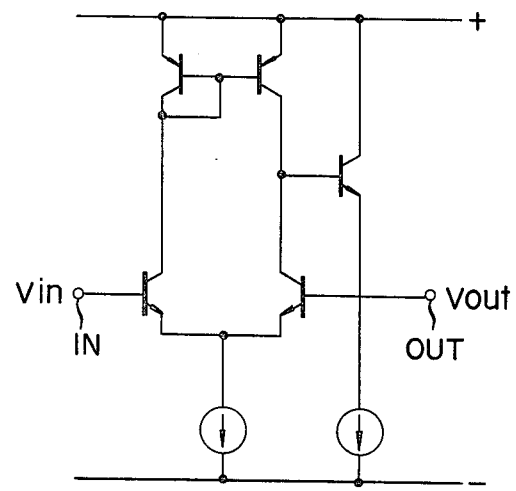
FIG. 1 is a circuit diagram of a prior art voltage follower circuit.
Figure 3:
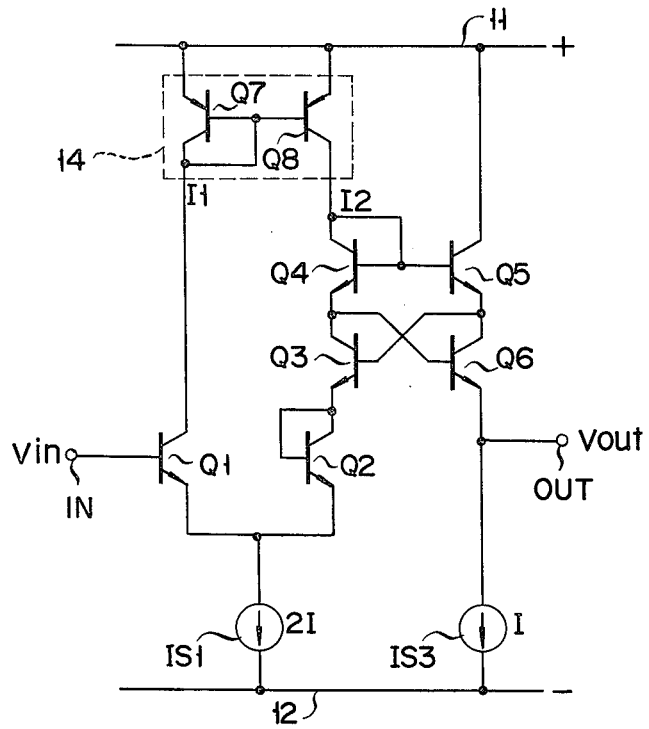
FIG. 3 shows a practical arrangement of a constant current source IS2 shown in FIG. 2.

If current source IS2 of the circuit in FIG. 2 is constituted by a current mirror circuit 14 consisting of transistors Q7 and Q8 as shown in FIG. 3, the offset error voltage Vos is expressed as follows:

$$\begin{aligned} Vos &= Vout - Vin \\ &= Vbe(Q2) + Vbe(Q3) + Vbe(Q5) - Vbe(Q1) - Vbe(Q4) - Vbe(Q6) \\ &= V_T \cdot l_n(I2/I1) \end{aligned} \quad (3)$$

where I1 is the collector current of transistor Q1, I2 the collector current of transistors Q2, Q3 and Q4, and $V_T$ the thermal voltage.

The following current equation is obtained at the collector of transistor Q8.

$$k \cdot I1 = I2 + 1/\beta(I + Io + I2) \quad (4)$$

where k is the current ratio between transistors Q7 and Q8, β the common-emitter current amplification factor, and Io the output current.

The sum of the emitter current of transistors Q1 and Q2 is given by $$I1 + I2 = 2I \quad (5)$$

The currents I1 and I2 are respectively obtained from equations (4) and (5) as follows:

$$I1 = \{1/(k+1+1/\beta)\} \cdot \{2I + (I+Io)/\beta\}$$
$$I2 = \{1/(k+1+1/\beta)\} \cdot \{2kI - (I+Io)/\beta\} \quad (6)$$

Substituting typical values, for example, β=100, I=100 μA, Io=0, and k=0.98 into equation (6) yields I1=101.5 μA and I2=98.48 μA. If these values of I1 and I2 and $V_T$=25 mV are substituted into equation (3), the offset error voltage Vos is found to be −0.76 mV. It is to be noted that this value is very small.

The feature of the circuit of FIG. 3 resides in the fact that the collector current I1 of transistor Q1 is made substantially equal to the collector current I2 of transistors Q2, Q3 and Q4 by current mirror circuit 14. In the optimum case of β=∞ and k=1, it is seen from equation (6) that I1=I2=I. If the output current Io=0, the offset error voltage Vos becomes zero since the collector currents of transistors Q1 to Q6 each equal I and the base-emitter voltages thereof are identical. In the circuits shown in FIGS. 2 and 3, since all the transistors Q1 to Q6 are connected in the emitter-follower configuration, the open-loop gain is unity and excellent stability is obtained. Furthermore, a capacitor is not required which is intended for the prevention of oscillation.

Figure 4:
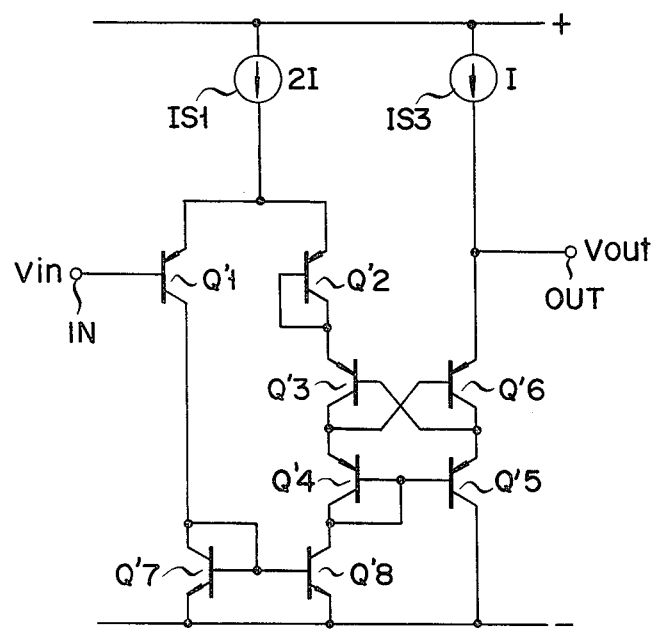
FIG. 4 is a circuit diagram showing a voltage follower circuit which uses transistors of opposite conductivity types as those in the voltage follower circuit shown in FIG. 3.

As shown in FIG. 4, a voltage follower circuit can be constituted by transistors Q'1 to Q'8 complementary to transistors Q1 to Q8 shown in FIGS. 2 and 3.

Figure 5:
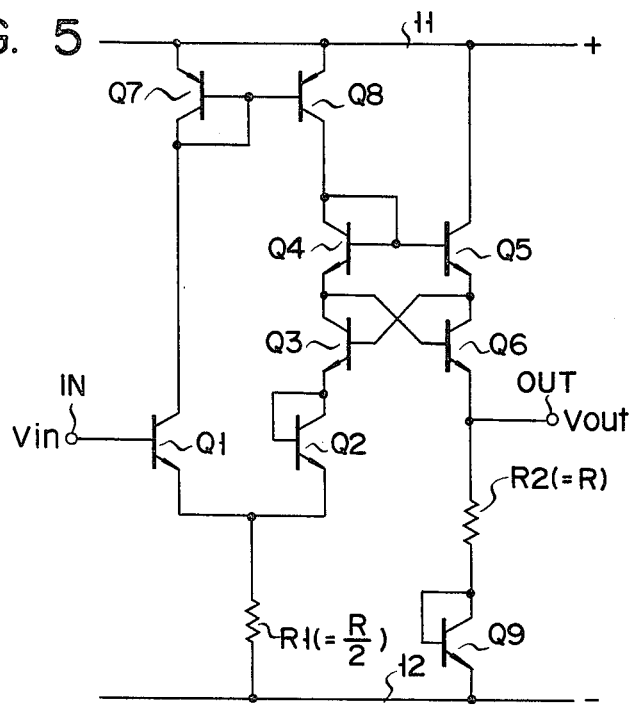
FIG. 5 is a voltage follower circuit which uses resistors as constant current sources IS1 and IS3 in FIG. 2.

The current sources IS1 and IS3 may be replaced, as shown in FIG. 5, by a resistor R1 having a resistance value of R/2 and a resistor R2 having a resistance value of R, respectively. To obtain a higher accuracy, a diode-connected transistor Q9 is connected in series with resistor R2.

Figure 6:
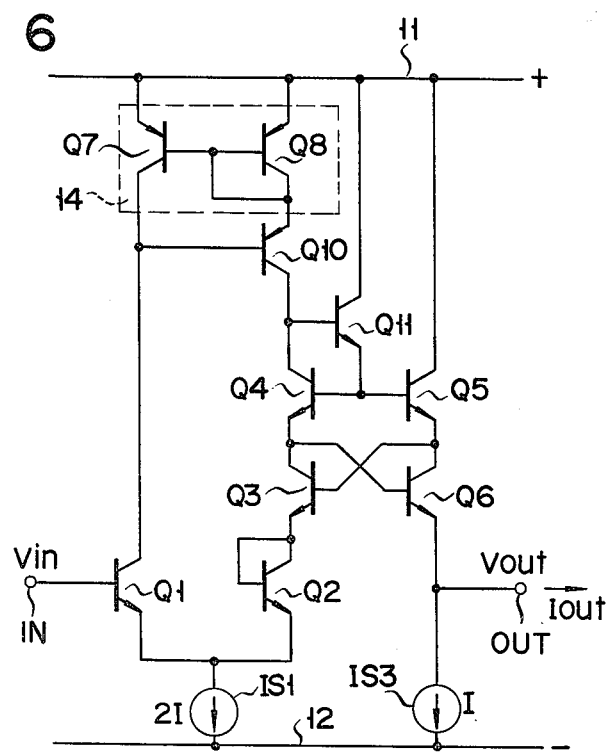
FIG. 6 shows a modification of the circuit shown in FIG. 2.

In order to raise the accuracy of the collector currents of transistors Q3 and Q4 supplied by current mirror circuit 14, the basic circuit of the present invention may be modified as shown in FIG. 6. Namely, a transistor Q10 of the same conductivity type as transistors Q7 and Q8 is provided which has its base connected to the collector of transistor Q7, its emitter connected to the collector of transistor Q8, and its collector connected to the collector of transistor Q4. Further, a transistor Q11 complementary to transistor Q10 is provided which has its base connected to the collector of transistor Q10, its collector connected to positive power supply line 11, and its emitter connected to the bases of transistors Q4 and Q5.

Figure 7:
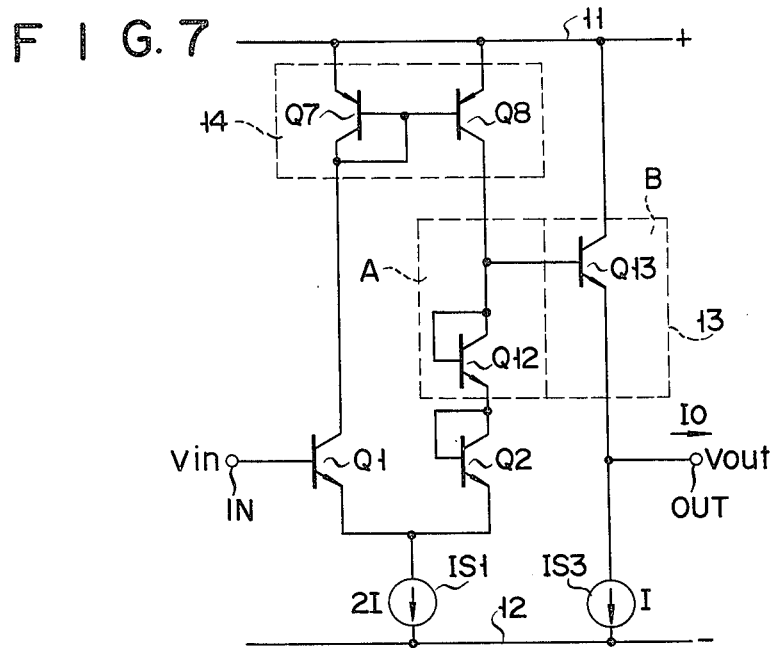
FIG. 7 shows in particular a modification of the voltage transfer circuit.

The voltage transfer circuit 13 may be arranged as shown in FIG. 7. Namely, circuit A includes a diode-connected transistor Q12 whose emitter and collector are connected to the collectors of transistors Q2 and Q8, respectively. Circuit B includes a transistor Q13 which has its base connected to the collector of transistor Q12, its collector connected to positive power supply line 11, and its emitter connected to output terminal OUT. The circuit of FIG. 7 can provide the same effect as the basic circuit of the present invention.

Figure 8:
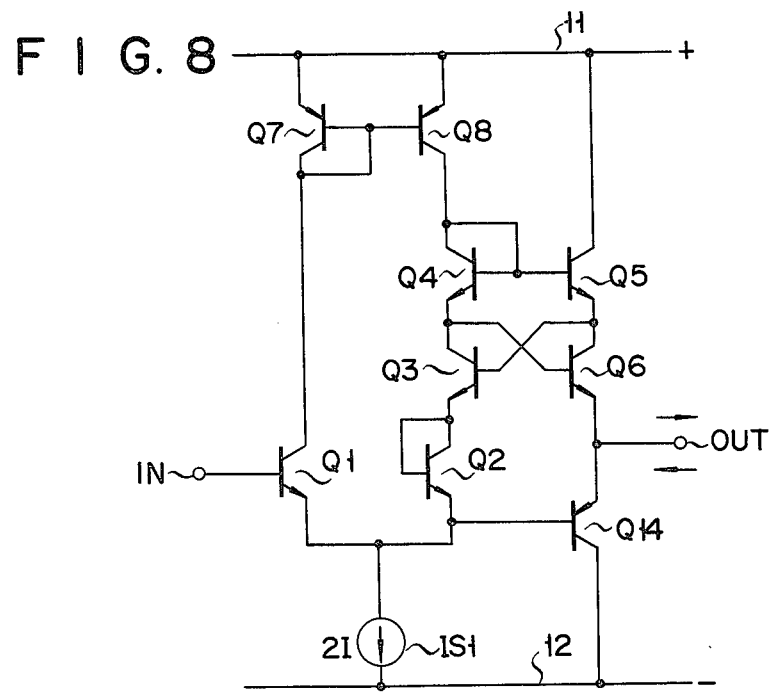
FIG. 8 shows another modification of the voltage transfer circuit.

FIG. 8 shows a modification of the output section. With the embodiment described above, the output current Io at output terminal OUT largely depends upon the current flowing out of transistor Q6. In the circuit of FIG. 8, current source IS3 is replaced by a PNP transistor Q14 having its base connected to the emitters of transistors Q1 and Q2, its emitter connected to output terminal OUT, and its collector connected to negative power supply line 12. With such an arrangement, output current Io consists of current supplied to output terminal OUT from transistor Q6 or current supplied to transistor Q14 from output terminal OUT.

Application circuits utilizing the basic arrangement of the voltage follower circuit described above will now be described.

Figure 9:
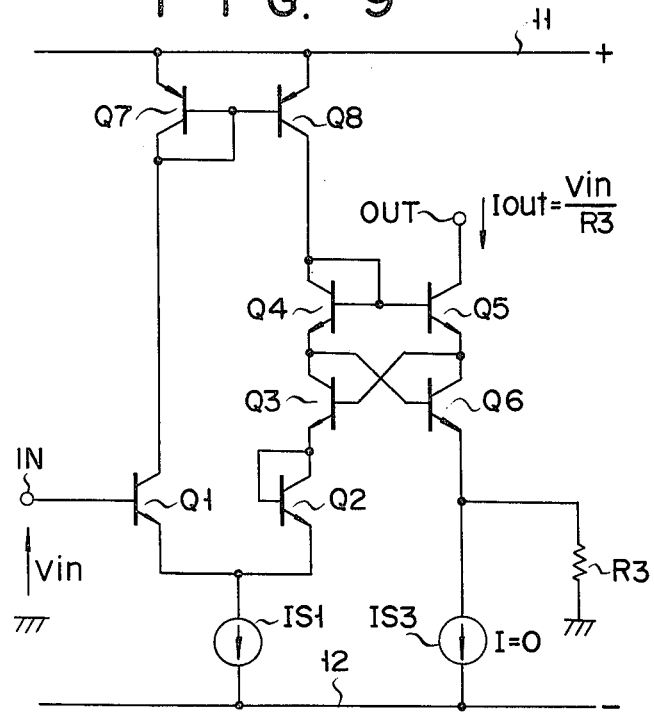

FIG. 9 shows a voltage-current converting circuit wherein a resistor R3 is connected between the emitter of transistor Q6 and circuit ground, the current of current source IS3 is set to zero, and an output current Iout is taken from the collector of transistor Q5. With this circuit, the output current Iout is $$Iout = Vin/R3$$

The voltage follower circuit of FIG. 6 can also be modified to a voltage-current converting circuit as shown in FIG. 9 so as to provides a better accuracy of the output current than the circuit of FIG. 9.

Figure 10:
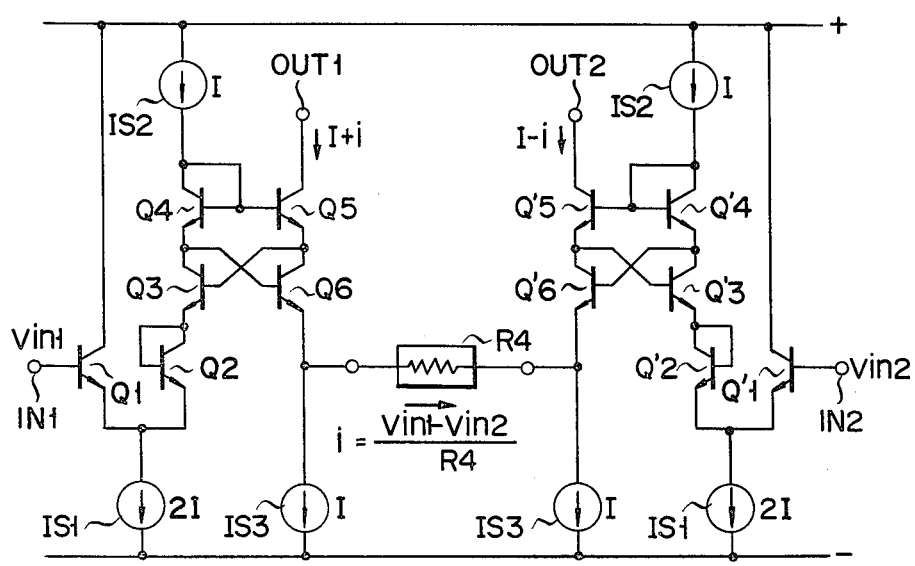

FIG. 10 shows a differential-type voltage-current converting circuit using two basic circuits. In this circuit, an input voltage Vin1 is applied to first input terminal IN1, while an input voltage Vin2 is applied to second input terminal IN2. Output currents Iout1 and Iout2 at output terminals OUT1 and OUT2 are given by $$\left.\begin{array}{l} Iout1 = I + i \\ Iout2 = I - i \end{array}\right\} \quad (7)$$

A differential output current Δiout given by $$\begin{aligned} \Delta iout &= Iout1 - Iout2 = 2i \\ &= 2/R4 \cdot \Delta Vin \\ &= 2/R4 \cdot (Vin1 - Vin2) \end{aligned} \quad (8)$$

It is seen that the differential output current Δiout is proportional to the differential input voltage ΔVin.

Figure 11:
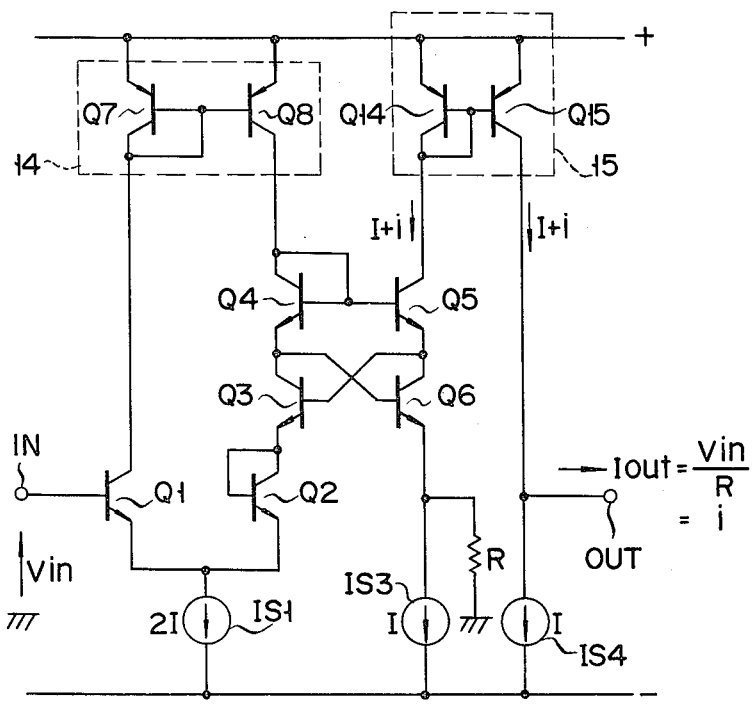

FIG. 11 shows a voltage-current converting circuit utilizing the circuit shown in FIG. 3. This circuit is provided with a current mirror circuit 15 consisting of transistors Q14 and Q15. The collector of transistor Q14 is connected to the collector of transistor Q5, while the collector of transistor Q15 is connected to output terminal OUT. A current source IS4 for supplying current I is connected between output terminal OUT and negative power supply line 12. In this circuit, the collector current of each of transistors Q14 and Q15 is I+i, and an output current Iout=Vin/R=i is taken from output terminal OUT.

Figure 12:
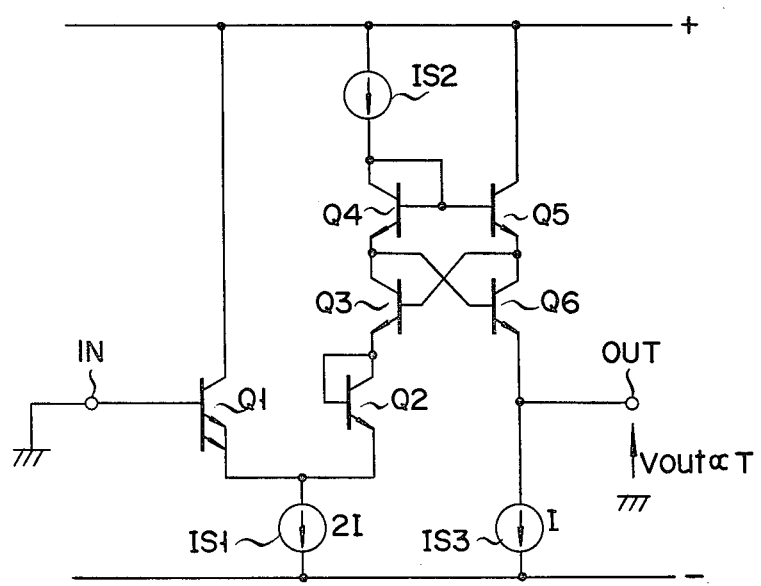

FIG. 12 shows a temperature-voltage converting circuit which uses the voltage follower circuit described above to produce a voltage proportional to absolute temperature T. In this circuit, the base of transistor Q1 is grounded, and thus the input voltage Vin is zero. Therefore, equation (1) is rewritten as follows $$\begin{aligned} Vout &= -Vbe(Q1) + Vbe(Q2) + Vbe(Q3) + \\ &\quad Vbe(Q5) - Vbe(Q4) - Vbe(Q6) \\ &= (k \cdot T)/q \cdot l_n(A1 \cdot A4 \cdot A6)/(A2 \cdot A3 \cdot A5) \end{aligned} \quad (9)$$

where A1 to A6 represent emitter areas of transistors Q1 to Q6, respectively and k is the Boltzmann constant.

When A3 to A6 are identical and A1=4A2, the output voltage Vout will be

Vout=0.115T (mV)

For example, Vout≃36 mV at T=300° K. (room temperature). In the circuit of FIG. 12, a positive output voltage is obtained when A1>A2, and a negative output voltage is obtained when A1<A2.

FIG. 13 shows a differential-type temperature-current converting circuit which uses a temperature-voltage converting circuit of A1>A2 and a temperature-voltage converting circuit of A1<A2. In this circuit, the output voltage Vout1 (>0) of transistor Q6 is $$Vout1 = (k \cdot T)/q \cdot l_n(A1 \cdot A4 \cdot A6)/(A2 \cdot A3 \cdot A5)$$

The output voltage Vout2 (<0) of transistor Q'6 is $$Vout2 = (k \cdot T)/q \cdot l_n(A1' \cdot A4' \cdot A6')/(A2' \cdot A3' \cdot A5')$$

Therefore, current iT which flows through resistor R is given by $$iT = 1/R \cdot (k \cdot T)/q \cdot \{l_n(A1 \cdot A4 \cdot A6)/(A2 \cdot A3 \cdot A5) - l_n(A1' \cdot A4' \cdot A6')/(A2' \cdot A3' \cdot A5')\} \quad (10)$$

The output currents Iout1 and Iout2 at output terminals OUT1 and OUT2 are given by $$\left.\begin{array}{l} Iout1 = I + iT \\ Iout2 = I - iT \end{array}\right\} \quad (11)$$

Substituting (A1.A4.A6)/(A2.A3.A5)=n² and (A1'.A4'.A6')/(A2'.A3'.A5')=1/n² into equation (10) yields $$iT = 4/R \cdot (k \cdot T)/q \cdot l_n n$$

Namely, the current iT is proportional to absolute temperature T.

FIG. 14 shows an analog multiplexer for multiplexing a plurality of input voltages in a time division manner. The analog multiplexer has a plurality of first transistors Q1a to Q1d whose bases are respectively connected to a plurality of input terminals IN1 to IN4, and a multi-emitter type transistor Q2a whose emitters are connected to the emitters of transistors Q1a to Q1d, respectively. The emitters of transistors Q1a to Q1d are connected to current sources IS1a to IS1d, respectively, through a switching circuit SW which comprises switching transistors Q21a to Q21d which are sequentially turned on by control signals applied to input terminals IN'1 to IN'4.

What is claimed is:
1. A voltage follower circuit comprising:
   first and second emitter-coupled transistors, said first transistor having its base connected to receive an input voltage, and said second transistor having its base shunted to its collector;
   a voltage transfer circuit having an input coupled to the collector of said second transistor and an output for transferring a voltage substantially the same as the collector voltage of said second transistor;
   a first current source connected to emitters of said first and second transistors;
   a current supply circuit for supplying a current to said second transistor through said voltage transfer circuit;
   a second current source connected to said output of said voltage transfer circuit;
   said voltage transfer circuit comprising third to sixth transistors, said third transistor having its emitter connected to the collector of said second transistor and its collector connected to an emitter of said fourth transistor, said fourth transistor having its collector connected to said current supply circuit and its base shunted to its collector, said sixth transistor having its emitter connected to the output of said voltage transfer circuit and its collector connected to an emitter of said fifth transistor, said third and sixth transistors being cross-coupled with respect to their bases and collectors, and said fourth and fifth transistors having their bases connected together.

2. A circuit according to claim 1 wherein said current supply circuit comprises a current mirror circuit.

3. A circuit according to claim 1 wherein said first and second current sources each comprise a resistor.

4. A circuit according to claim 1 further comprising a seventh transistor having its emitter connected to said current supply circuit and its collector connected to the collector of said fourth transistor; and an eighth transistor having its base connected to the collector of said fourth transistor, and its emitter connected to the base of said fourth transistor.

5. A circuit according to claim 2 further comprising a second current mirror circuit, said fifth transistor having its collector connected to said second current mirror circuit.

* * * * *